(12) United States Patent
Chew et al.

(10) Patent No.: US 6,258,653 B1
(45) Date of Patent: Jul. 10, 2001

(54) SILICON NITRIDE BARRIER FOR CAPACITANCE MAXIMIZATION OF TANTALUM OXIDE CAPACITOR

(75) Inventors: Kok Heng Chew, Fremont; Patrick van Cleemput, Sunnyvale; Kathy Konjuh; Tirunelveli Subramaniam Ravi, both of San Jose, all of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/511,738

(22) Filed: Feb. 24, 2000

(51) Int. Cl.[7] .................................................. H01L 21/8242
(52) U.S. Cl. ........................ 438/239; 438/238; 438/252; 438/253
(58) Field of Search ................................. 438/239, 238, 438/253, 252

(56) References Cited

U.S. PATENT DOCUMENTS 5,552,334 * 9/1996 Tseng ........................................ 437/52
5,686,337 * 11/1997 Koh et al. ................................ 437/52
5,712,202 * 1/1998 Liaw et al. .............................. 438/253

* cited by examiner

Primary Examiner—Richard Elms
Assistant Examiner—Pho Luu
(74) Attorney, Agent, or Firm—DeLio & Peterson, LLC; Peter W. Peterson; Roland Tso

(57) ABSTRACT

A method of making a capacitor on a conductive surface, preferably on a polysilicon surface includes contamination cleaning the surface with a high density plasma (HDP) of a first gaseous agent, such as hydrogen, then growing a silicon nitride barrier layer on the surface using a high density plasma (HDP) of nitrogen. A layer of tantalum oxide is then deposited on the silicon nitride layer to form a capacitor dielectric layer. A second silicon nitride layer is then grown on the capacitor dielectric layer, also using an HDP nitrogen plasma with the addition of a silicon containing gas, such as silane. Finally, a conductive layer is deposited on the second silicon nitride layer to form the capacitor. The HDP plasma is heated using an inductively coupled radio frequency generator. The invention also includes a capacitor constructed on a conductive surface by the method of the invention.

14 Claims, 1 Drawing Sheet

SILICON NITRIDE BARRIER FOR CAPACITANCE MAXIMIZATION OF TANTALUM OXIDE CAPACITOR

BACKGROUND OF THE INVENTION

1. Field of the Invention

The present invention relates to capacitors formed on conductive surfaces, preferably silicon surfaces, during the construction of integrated circuits. More specifically, the present invention relates to a method of making a capacitor in which silicon nitride barriers are formed between conductive surfaces forming the plates of a capacitor and a capacitor dielectric layer of tantalum oxide located between the conductive surfaces.

2. Description of Related Art

As the memory size of dynamic random access memory (DRAM) devices increases into the gigabit range, the dimensions of all memory structures and the space allotted on the semiconductor substrate for those structures have decreased. To produce capacitors of the necessary value within the limited space available, conventional oxide/nitride/oxide stack dielectrics have had to be constructed ever thinner and thinner. Such stack dielectrics are beginning to reach the practical limit of how thin they may be deposited.

One solution to this is to use tantalum oxide to replace oxide/nitride/oxide stacks as the capacitor dielectric. Tantalum oxide ($Ta_2O_5$) has a higher dielectric constant and produces a correspondingly higher capacitance in the resulting capacitor.

A problem with the use of tantalum oxide, however, is that the tantalum oxide deposition process results in the formation of a thin silicon oxide interface when the tantalum oxide is deposited directly on a polysilicon bottom electrode.

This silicon oxide interface reduces the overall capacitance and degrades device functionality. To prevent the formation of the undesirable silicon oxide interface, it is known to deposit a thin nitride layer over the polysilicon before depositing the tantalum oxide. This nitride layer has a higher dielectric constant ($K_{SiN}=7$) than the silicon oxide ($K_{SiO2}=4$).

In the prior art implementation of this deposition process, the nitride layer has been deposited using a rapid thermal nitridation (RTN) process. The RTN process, however, is a relatively slow and costly process. This results from the multiple processing steps required. Further, the RTN process results in a nitride layer that is not uniformly thick. This adversely affects the performance of the capacitor being constructed.

Bearing in mind the problems and deficiencies of the prior art, it is therefore an object of the present invention to provide a method of making a capacitor in which the capacitor dielectric layer is separated from the conductive surface by a silicon nitride layer that is uniformly thick.

It is another object of the present invention to provide a method of making a capacitor in which the capacitor dielectric layer is separated from the conductive surface by a silicon nitride layer that can be constructed with fewer steps and less expensively than when constructed with the RTN process.

Still other objects and advantages of the invention will in part be obvious and will in part be apparent from the specification.

SUMMARY OF THE INVENTION

The present invention uses a high density plasma (HDP) nitridation method to produce a high quality silicon nitride layer for separating a tantalum oxide layer in a capacitor from the conductive surfaces on either side of the tantalum oxide. A particular benefit of using the HDP process is the elimination of the more costly RTN process and the improved wafer throughput.

A further benefit of using HDP is that cleaning of the conductive surface and silicon nitridation can be performed as a single integrated process in a single chamber. The above and other objects and advantages, which will be apparent to ne of skill in the art, are achieved in the present invention which is directed to, in first aspect, a method of making a capacitor including the steps of providing a conductive surface, contamination cleaning the conductive surface in a chamber sing a high density plasma of a first gaseous agent, growing a first silicon nitride layer on the silicon surface using a high density plasma of nitrogen, depositing tantalum oxide on the silicon nitride layer to form a capacitor dielectric layer, growing a second silicon nitride layer on the capacitor dielectric layer using a high density plasma of nitrogen and a silicon containing gaseous agent, and depositing a conductive layer over the second silicon nitride layer to form the capacitor.

The conductive surface forming the lower plate of the capacitor is preferably silicon, and most preferably, polysilicon. The first gaseous agent in the step of contamination cleaning is preferably hydrogen. The high density plasma of nitrogen used in the step of growing a first silicon nitride layer on the conductive surface is formed by heating nitrogen gas with an inductively coupled radio frequency generator.

In the most highly preferred implementation of the method, the steps of contamination cleaning and growing a first silicon nitride layer are both completed in the same chamber without removing the conductive surface from the chamber. This speeds processing as compared to RTN processing.

The first silicon nitride layer is constructed with a thickness of less than 100 Angstroms, and it is preferred to be between about 10 and 40 Angstroms thick. The high density plasma used during the step of growing a first silicon nitride layer on the conductive surface is formed by heating with an inductively coupled radio frequency generator operating at between about 2000 and 4800 watts and the conductive surface is exposed to the nitrogen plasma for a period of time ranging from about 3 to 60 seconds. Similar exposure times and heating temperatures are used during the contamination cleaning step with the high density hydrogen plasma.

During the step of growing the first silicon nitride layer on the silicon surface, argon may be added to the high density plasma of nitrogen. During the step of growing a second silicon nitride layer on the capacitor dielectric layer, silane may be used as the silicon containing gaseous agent.

The invention also includes a capacitor constructed on a conductive surface by a method comprising the steps described above. The resulting capacitor includes a uniform (<2%, 1 sigma) silicon nitride layer on each side of the tantalum oxide layer.

BRIEF DESCRIPTION OF THE DRAWINGS

The features of the invention believed to be novel and the elements characteristic of the invention are set forth with particularity in the appended claims. The figures are for illustration purposes only and are not drawn to scale. the invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
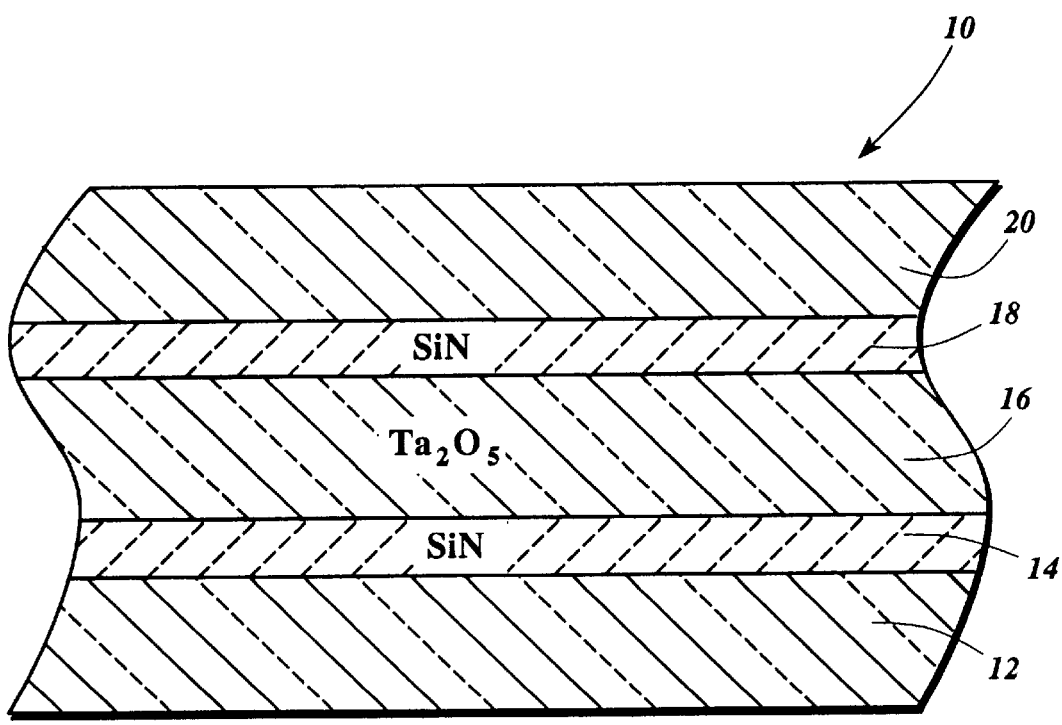
FIG. 1 is a cross sectional view of a capacitor constructed according to the method of the present invention.

In describing the preferred embodiment of the present invention, reference will be made herein to FIG. 1. Features of the invention are not necessarily shown to scale in this drawing.

FIG. 1 shows a cross-section through a capacitor 10 constructed on a conductive surface 12 according to the method of this invention. The surface 12 acts as a lower capacitor plate. The capacitor 10 includes a first silicon nitride layer 14 separating the conductive surface 12 from the capacitor dielectric layer 16. The capacitor dielectric layer 16 is formed of tantalum oxide ($Ta_2O_5$). A second silicon nitride layer 18 separates the capacitor dielectric layer 16 from an overlying conductive layer 20 which forms the upper capacitor plate.

The method of this invention produces a capacitor having a very thin and uniform dielectric composed of the two silicon nitride layers 14, 16, and the tantalum oxide layer 16. The method begins by contamination cleaning the exposed conductive surface 12 in a high density plasma chamber using a high density plasma of a first gaseous agent, which is preferably hydrogen. In some applications, argon or oxygen may also be used in combination with or instead of hydrogen to obtain a clean surface.

In the preferred embodiment, surface 12 is a silicon surface, most preferably, polysilicon. However, other conventional conductive materials may also be used. After the step of contamination cleaning, the first silicon nitride layer 14 is grown on the silicon surface 12 using a high density plasma of nitrogen. Argon may also be used with the nitrogen. The high density nitrogen plasma reacts with the exposed silicon surface to form the silicon nitride layer 14. Tantalum oxide is then deposited on the silicon nitride layer 14 in a conventional manner to form the capacitor dielectric layer 16.

Next, a second silicon nitride layer 18 is formed on the capacitor dielectric layer 16. Because the tantalum oxide layer contains no silicon, the step of growing the second silicon nitride layer on the capacitor dielectric layer uses a high density plasma of nitrogen and a gaseous agent containing silicon, such as silane ($SiH_4$).

After the second silicon nitride layer is grown, the upper capacitor plate, comprising conductive layer 20, is deposited. The conductive layer may be any conventional conductive material suitable for capacitors, including metals and compounds containing metals such as platinum, tungsten and tin, oxides such as ruthenium oxide, and conductive materials such as silicon and polysilicon. These materials may also be used for the lower capacitor plate to form surface 12, in which case the step of forming the first silicon nitride layer on the surface 12 will use a silicon containing gas, such as silane, in combination with nitrogen in the high density plasma.

An example of a suitable method for making a capacitor according to this method starts by contamination cleaning a silicon surface in an HDP chamber according to the following processing parameters:

$H_2$ Heating Step for Contamination Cleaning:

| | |
|---|---|
| Low Frequency power: | 2000–4800 Watt |
| $H_2$ gas: | 200–500 sccm |
| Stationary deposition time: | 3–60 seconds |
| Wafer temperature: | 300–450° C. |

In the contamination cleaning step described above, the hydrogen is used in a plasma reduction step which cleans the bare silicon wafer surface and removes contaminants. When the $H_2$ heating/contamination cleaning step is completed the first nitridation step takes place, preferably in the same HDP chamber. Example nitridation process parameters are as follows:

Nitridation Step:

| | |
|---|---|
| Low Frequency power: | 2000–4800 Watt |
| $N_2$ gas: | 200–500 sccm |
| Ar gas: | 0–200 sccm |
| Stationary deposition time: | 3–300 seconds |
| Deposition temperature: | 300–500° C. |

Where the underlying conductive surface contains no silicon, the nitridation step adds a gaseous agent containing silicon, such as silane ($SiH_4$) at a sufficient rate for the supplied nitrogen gas which may be about 0–500 sccm (standard cubic centimeters per minute) for the process described above.

The nitridation step produces a silicon nitride layer that is less than 100 Angstroms thick. Preferably, the silicon nitride layer is between about 10 and 40 Angstroms thick. In both the nitridation and the contamination cleaning steps, it is preferred for the HDP plasma to be formed by heating the gaseous agent with an inductively coupled radio frequency generator.

When the nitridation step is completed, the HDP chamber is switched to an idle plasma state. The idle plasma state consists of the parameter set described in the contamination cleaning step. In this idle plasma state, the wafer is removed from the HDP deposition chamber. The wafer is then ready for the tantalum oxide ($Ta_2O_5$) deposition in the next step of device fabrication.

Tantalum oxide deposition occurs in the conventional manner to form a capacitor dielectric layer. Following tantalum oxide deposition, the tantalum oxide layer is cleaned. Cleaning may be accomplished using the same contamination cleaning step described above. The second silicon nitride layer is then grown on the clean tantalum oxide layer. The second silicon nitride layer is grown using the same parameter set described above, with the silane gas (or other silicon containing gaseous agent), to supply the necessary silicon.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of making a capacitor comprising the steps of:
   providing a conductive surface comprising silicon;
   contamination cleaning the conductive surface in a chamber using a high density plasma of a first gaseous agent;
   growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

2. A method of making a capacitor comprising the steps of:

providing a conductive surface;

contamination cleaning the conductive surface in a chamber using a high density plasma of a first gaseous agent comprising hydrogen;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

3. A method of making a capacitor comprising the steps of:

providing a conductive surface;

contamination cleaning the conductive surface in a chamber using a high density plasma of a first gaseous agent;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent, the high density plasma of nitrogen being formed by heating nitrogen gas with an inductively coupled radio frequency generator; and depositing a conductive layer over the second silicon nitride layer to form the capacitor.

4. A method of making a capacitor comprising the steps of:

providing a conductive surface;

contamination cleaning the conductive surface in a chamber using a high density plasma of a first gaseous agent;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor;

the steps of contamination cleaning and growing a first silicon nitride layer both being completed in the chamber without removing the conductive surface from the chamber.

5. The method of making a capacitor according to claim 4 wherein the high density plasmas used during the steps of the method are formed by heating with an inductively coupled radio frequency generator.

6. A method of making a capacitor comprising the steps of:

providing a conductive surface;

contamination cleaning the conductive surface in a chamber using a high density plasma of a first gaseous agent;

growing a first silicon nitride layer on the silicon surface using a high density plasma of nitrogen, the high density plasma of nitrogen being formed by heating the nitrogen with an inductively coupled radio frequency generator operating at between about 2000 and 4800 watts;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

7. The method of making a capacitor according to claim 6 wherein the high density plasma used during the step of contamination cleaning is a hydrogen plasma and the conductive surface is exposed to the hydrogen plasma for a period of time ranging from about 3 to 60 seconds.

8. The method of making a capacitor according to claim 7 wherein the high density plasma used during the step of contamination cleaning is a hydrogen plasma and the conductive surface is held at a temperature between about 300 and 450 ° C.

9. A method of making a capacitor comprising the steps of:

providing a conductive surface;

contamination cleaning the conductive surface in a chamber using a high density plasma of a first gaseous agent, the high density plasma being formed by heating the first gaseous agent with an inductively coupled radio frequency generator operating at between about 2000 and 4800 watts;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

10. A method of making a capacitor comprising the steps of:

providing a conductive surface;

contamination cleaning the conductive surface in a chamber using a high density plasma of a first gaseous agent comprising hydrogen, the hydrogen plasma being formed by heating the hydrogen with an inductively coupled radio frequency generator operating at between about 2000 and 4800 watts;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

11. A method of making a capacitor comprising the steps of:

providing a conductive surface;

contamination cleaning the conductive surface in a chamber using a high density plasma of a first gaseous agent;

growing a first silicon nitride layer on the silicon surface using a high density plasma of nitrogen and argon;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

12. A method of making a capacitor comprising the steps of:

providing a conductive surface;

contamination cleaning the conductive surface in a chamber using a high density plasma of a first gaseous agent;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and silane; and depositing a conductive layer over the second silicon nitride layer to form the capacitor.

13. A capacitor constructed on a conductive surface by a method comprising the steps of:

providing a conductive surface;

contamination cleaning the conductive surface in a chamber using a high density plasma of a first gaseous agent comprising hydrogen;

growing a first silicon nitride layer on the silicon surface using a high density plasma of nitrogen;

depositing tantalum oxide on the silicon nitride layer to form a capacitor dielectric layer;

growing a second silicon nitride layer on the capacitor dielectric layer using a high density plasma of nitrogen and a silicon containing gaseous agent; and depositing a conductive layer over the second silicon nitride layer to form the capacitor.

14. The capacitor of claim 13 wherein the high density plasmas used during the steps of the method are formed by heating with an inductively coupled radio frequency generator.

* * * * *

UNITED STATES PATENT AND TRADEMARK OFFICE
CERTIFICATE OF CORRECTION

PATENT NO. : 6,258,653 B1
DATED : July 10, 2001
INVENTOR(S) : Chew et al.

It is certified that error appears in the above-identified patent and that said Letters Patent is hereby corrected as shown below:

Column 2,
Line 10, delete "ne" and substitute therefore -- one --
Line 11, after "in" and before "aspect" insert therefore -- a --.
Line 14, delete "sing" and substitute therefore -- using --
Line 63, delete "the" and substitute therefore -- The --

Column 3,
Line 25, delete first occurrence "16" and substitute therefore -- 18 --

Signed and Sealed this

Twenty-first Day of June, 2005

JON W. DUDAS
*Director of the United States Patent and Trademark Office*